United States Patent
Kasahara

(10) Patent No.: US 8,085,105 B2
(45) Date of Patent: Dec. 27, 2011

(54) CONSTANT-TEMPERATURE TYPE CRYSTAL OSCILLATOR

(75) Inventor: Kenji Kasahara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 98 days.

(21) Appl. No.: 12/618,315

(22) Filed: Nov. 13, 2009

(65) Prior Publication Data
US 2010/0123522 A1 May 20, 2010

(30) Foreign Application Priority Data
Nov. 14, 2008 (JP) .................. 2008-292302

(51) Int. Cl.
*H03L 1/00* (2006.01)
(52) U.S. Cl. .................. 331/176; 331/158; 331/116 FE; 331/116 R
(58) Field of Classification Search .................. 331/158, 331/116 FE, 116 R, 176
See application file for complete search history.

(56) References Cited

U.S. PATENT DOCUMENTS

| 7,253,694 B2 | 8/2007 | Hardy et al. | |
| 7,382,204 B2 * | 6/2008 | Arai et al. | 331/69 |
| 2007/0268079 A1 | 11/2007 | Hardy et al. | |

FOREIGN PATENT DOCUMENTS

| JP | 2005-196355 A | 7/2000 |
| JP | 2005-165630 A | 6/2005 |
| JP | 2006-311496 | 11/2006 |
| JP | 2006-311496 A | 11/2006 |

* cited by examiner

*Primary Examiner* — Arnold Kinkead
(74) *Attorney, Agent, or Firm* — Carrier Blackman & Associates, P.C.; Joseph P. Carrier; William D. Blackman

(57) ABSTRACT

A constant-temperature type crystal oscillator includes: a crystal unit including a case main body including a first power source terminal on an outer bottom surface thereof; a surface-mounted oscillator; a temperature control circuit including a heating resistor and a temperature sensor; and a circuit substrate including a second power source terminal. One ends of the heating resistor and the temperature sensor are electrically connected to the second power source terminal. The first power source terminal of the surface-mounted oscillator and the one ends of the heating resistor and the temperature sensor are electrically connected to the second power source terminal of the circuit substrate. The first power source terminal of the surface-mounted oscillator is directly and electrically connected to, at least, the one end of the temperature sensor via an electrically-conducting path.

8 Claims, 10 Drawing Sheets

BACKGROUND ART

CONSTANT-TEMPERATURE TYPE CRYSTAL OSCILLATOR

This application claims priority from Japanese Patent Application No. 2008-292302 filed on Nov. 14, 2008, the entire subject matter of which is incorporated herein by reference.

BACKGROUND OF THE INVENTION

1. Field of the Invention

The invention relates to a technical field of a constant-temperature type crystal oscillator (hereinafter called constant-temperature type oscillator) using a heating resistor composed of a chip resistor as a heating source, and in particular, to a constant-temperature type oscillator that detects an operational temperature of a crystal unit in real time.

2. Description of the Related Art

Constant-temperature type oscillators keep the operational temperatures of their crystal units constant so as to even the frequency-temperature characteristics of the crystal oscillators. Therefore, the constant-temperature type oscillators are applied to communication facilities (wireless devices) for base stations or the like that are required to have frequency stability, for example, of 0.1 ppm (parts per ten million) or less or in the order of 1 ppb (parts per billion). As one of these, there is a constant-temperature type oscillator configured to use a crystal unit for surface mounting (hereinafter called surface-mounted unit) (see, for example, JP-A-2006-311496).

FIGS. 6A to 7B are diagrams for explanation of one example of a related art constant-temperature type oscillator. FIG. 6A is a cross-sectional view of a related art constant-temperature type oscillator, and FIG. 6B is an outline of a circuit diagram thereof. FIG. 7A is a cross-sectional view of a related art surface-mounted unit of the related art constant-temperature type oscillator, and FIG. 7B is a bottom view thereof.

As show in FIGS. 6A and 6B, the constant-temperature type oscillator has a surface-mounted unit 1, an oscillating part 2a forming an oscillator circuit 2, respective circuit elements 4 forming a temperature control circuit 3, and a circuit substrate 5 on which these are installed. Then, the constant-temperature type oscillator is configured such that the circuit substrate 5 is held with lead wires 8 of a base for oscillator 7 which is made airtight with glass 6, and these are covered with a cover for oscillator 9 by resistance welding or the like. However, there are various forms as an oscillator case composed of the base for oscillator 7 and the cover for oscillator 9, and a form of the oscillator case is selected as needed.

With respect to the surface-mounted unit 1, as shown in FIGS. 7A and 7B, a crystal element 1A is housed in a case main body 10, and the case main body 10 is sealed up with a metal cover 11 by seam welding or the like on a metal ring 10a that is formed on an opening end face of the case main body 10. The case main body 10 is formed to be concave, for example. The case main body 10 is made of laminar ceramic, for example. The case main body 10 has a crystal holding terminal 19 on an inner wall shoulder of the case main body 10. Both sides of one end of the crystal element 1A where a leading electrode (not shown) is extended from an excitation electrode (not shown) are firmly fixed to the crystal holding terminal 19 by an electrically conductive adhesive 20.

Then, the case main body 10 has crystal terminals 12a as mounting terminals 12 electrically connected to the crystal element 1A on a set of diagonal corners of the outer bottom face, for example, and has dummy terminals 12b on the other set of diagonal corners. The dummy terminals 12b are electrically connected to the metal cover 11 via an electrically-conducting path including a through electrode and the like, for example. Normally, the dummy terminals 12b are connected to the ground potential.

Then, the crystal element 1A is formed as an SC-cut crystal element or an AT-cut crystal element, for example. The crystal element 1A has the frequency-temperature characteristic that an extreme value is approximately 80° C. at the higher temperature side higher than or equal to 25° C. as room temperature, and the oscillating frequency varies according to a temperature in any case of both of the SC-cut and AT-cut crystal elements. For example, in an AT-cut crystal element, the frequency-temperature characteristic shows a cubic curve (curve A in FIG. 8), and in an SC-cut crystal element, the frequency-temperature characteristic shows a quadratic curve (curve B in FIG. 8). Incidentally, frequency deviation $\Delta f/f$ is plotted along the ordinate of the diagram, where f is a frequency at room temperature, and $\Delta f$ is a frequency difference from the frequency f at room temperature.

As shown in FIG. 6B, the oscillator circuit 2 is formed as a so-called Colpitts type circuit so as to have the oscillating part 2a that forms a resonance circuit along with the surface-mounted unit 1. The oscillating part 2a includes a voltage dividing capacitor, a transistor for oscillation that amplifies and feeds it back, and the like (not shown). Here, the oscillator circuit 2 is formed to be a voltage control type circuit having a voltage-controlled capacitive element 4Cv in an oscillatory loop, for example. In the drawing, Vcc is a power source, Vout is an output, Vgnd is the ground (earth potential), and Vc is a control voltage such as AFC voltage, and these are electrically connected to the circuit substrate 5 via the respective lead wires 8. Further, the power source Vcc is common in the oscillator circuit 2 and the temperature control circuit 3.

In the temperature control circuit 3, a temperature sensing voltage Vt by a temperature sensor (for example, thermistor) 4th and a resistor 4R1 is applied to one input terminal of an operational amplifier 4OA, and a reference voltage Vr by resistors 4R2 and 4R3 is applied to the other input terminal thereof. Then, a differential voltage between the reference voltage Vr and the temperature sensing voltage Vt is applied to the base of a power transistor 4Tr, and electric power from the power source Vcc is supplied to a chip resistor 4h (hereinafter called heating resistor 4h) serving as a heating element. Thereby, the electric power to the heating resistor 4h is controlled with a temperature-dependent resistance value of the temperature sensor 4th, to keep the operational temperature of the surface-mounted unit 1 constant. An operational temperature is to be approximately 80° C. which is a minimum value or a maximum value at room temperature or more (FIG. 8), for example.

A circuit pattern (not shown) is formed on the circuit substrate 5, and the respective circuit elements 4 including the surface-mounted unit 1 are installed on both principal surfaces of the circuit substrate 5. In this example, the heating resistor 4h, the power transistor 4Tr and the temperature sensor 4th in the temperature control circuit 3 and the surface-mounted unit 1 are installed on the bottom face of the circuit substrate 5. The surface-mounted unit 1 is installed on the central area, and the heating resistor 4h, the power transistor 4Tr and the temperature sensor 4th are installed on the outer circumference of the surface-mounted unit 1.

Incidentally, the voltage-controlled capacitive element 4Cv, which is temperature-dependent to greatly vary its characteristic, is installed on the outer circumference of the surface-mounted unit 1. The surface-mounted unit 1 and these circuit elements (4h, 4Tr, 4th, 4Cv) are covered with heat conducting resin 13. Alternatively, the spaces among the surface-mounted unit 1 and these circuit elements (4h, 4Tr, 4th, 4Cv) are filled with the heat conducting resin 13, and these are thermally coupled.

Then, other circuit elements 4 of the oscillator circuit 2 and the temperature control circuit 3 are installed on the top face of the circuit substrate 5. In this case, for example, a capacitor for adjusting oscillating frequency and the like are installed on the top face of the circuit substrate 5, which makes it easy to adjust the oscillating frequency. Then, in particular, the respective circuit elements 4 of the oscillating part 2a having an effect on an oscillating frequency are disposed on the top face of the circuit substrate 5 facing the area covered with the heat conducting resin 13.

Incidentally, U.S. Pat. No. 7,253,694 B2 and US 2007/0268079 A1 each discloses a related art constant-temperature type oscillator.

In the constant-temperature type oscillator having the above-described configuration, the heating resistor 4h and the surface-mounted unit 1 are thermally coupled with the heat conducting resin 13. However, the heat conductivity of the heat conducting resin 13 is less than or equal to $1/100$ of that of the electrically-conducting path 14 as a circuit pattern, for example, metal such as gold (Au) or copper (Cu). Thus, the heat conductivity (heat conduction efficiency) between the heating resistor 4h and the surface-mounted unit 1 becomes worse. Meanwhile, the heat conductivity of the heat conducting resin 13, for example, KE-3467 is 2.4 W/(m·K), and those of Au and Cu serving as an electrically-conducting path are 319 W/(m·K) and 403 W/(m·K), respectively.

As shown in FIG. 9, one end sides (power source (Vcc) sides) of the heating resistor 4h and the temperature sensor 4th in the temperature control circuit 3 are directly and electrically connected via the electrically-conducting path 14 on the circuit substrate 5. Therefore, a heated temperature by the heating resistor 4h is directly transferred to the temperature sensor 4th via the electrically-conducting path 14 (for example, metal such as Au) with high heat conductivity, and temperature of the temperature sensor 4th approximately corresponds to the heated temperature by the heating resistor 4h.

On the other hand, even if the oscillator circuit 2 and the temperature control circuit 3 are connected so as to have the same power source Vcc as their power sources, the heating resistor 4h and the crystal terminal 12a of the surface-mounted unit 1 are electrically connected to one another via the oscillating part 2a. Therefore, a heated temperature by the heating resistor 4h is absorbed by the circuit elements 4 of the oscillating part 2a, and is not directly transferred to the surface-mounted unit 1 (the case main body 10). Thus, an operational temperature of the surface-mounted unit 1 is reduced to be lower than the heated temperature by the heating resistor 4h. In addition, the operational temperature of the surface-mounted unit 1 reaches the heated temperature by the heating resistor 4h after the temperature of the heating resistor 4h reaches the heated temperature.

Therefore, even if a heated temperature by the heating resistor 4h and a detected temperature by the temperature sensor 4th correspond, the detected temperature of the temperature sensor 4th does not correspond with an operational temperature of the surface-mounted unit 1, and a heated temperature higher than the operational temperature of the surface-mounted unit 1 is detected as an operational temperature. Then, an operational temperature of the crystal unit approximates the detected temperature by the temperature sensor 4th as time advances. In this way, specifically the detected temperature by the temperature sensor 4th does not correspond with an operational temperature of the surface-mounted unit 1. Thus, it becomes difficult to control the temperature of the surface-mounted unit 1 in real time for an ambient temperature.

Further, in these constant-temperature type oscillators, the surface-mounted unit 1 is adopted. However, because the other circuit elements 4 are installed as discrete components on the circuit substrate 5, the structure of the constant-temperature type oscillator becomes complicated, and thus simplification thereof becomes difficult.

SUMMARY OF THE INVENTION

An object of the invention is to provide a constant-temperature type oscillator in which real-time temperature control thereof is made easy by directly detecting an operational temperature of a crystal unit.

In the invention, as shown in JP-A-2006-311496, one end of the temperature sensor is electrically connected to the mounting terminals (normal earth terminals) serving as floating terminals on the outer bottom face of the surface-mounted unit (the case main body). In this respect, the invention has been achieved by focusing attention on the technology in which an operational temperature of a crystal unit is directly detected via an electrically-conducting path with high heat conductivity made of metal such as Au. However, in this case, redundant electrically-conducting path, which is unnecessary under normal circumstances, is formed. Thus, the wiring pattern of the electrically-conducting path becomes complicated.

According to a first aspect of the invention, there is provided a constant-temperature type crystal oscillator comprising: a crystal unit comprising: a case main body comprising first mounting terminals for surface mounting including a first power source terminal on an outer bottom surface of the case main body; and a crystal element that is hermetically encapsulated in the case main body; a surface-mounted oscillator, which comprises an IC chip housed in the case main body, and which forms an oscillator circuit with at least the crystal unit; a temperature control circuit comprising: a heating resistor composed of a chip element for heating up the crystal unit; and a temperature sensor that detects an operational temperature of the crystal unit; and a circuit substrate, on which the surface-mounted oscillator, the heating resistor, and the temperature sensor are installed, and which comprises second mounting terminals including a second power source terminal, wherein one ends of the heating resistor and the temperature sensor are electrically connected to the second power source terminal, wherein the first power source terminal of the surface-mounted oscillator and the one ends of the heating resistor and the temperature sensor are electrically connected to the second power source terminal of the circuit substrate, and wherein the first power source terminal of the surface-mounted oscillator is directly and electrically connected to, at least, the one end of the temperature sensor via an electrically-conducting path.

According to a second aspect of the invention, in the constant-temperature type crystal oscillator, wherein the first power source terminal of the surface-mounted oscillator, the one ends of the heating resistor and the temperature sensor are directly and electrically connected to the second power source terminal of the circuit substrate via the electrically-conducting path on the circuit substrate.

According to a third aspect of the invention, in the constant-temperature type crystal oscillator, wherein a constant voltage circuit is provided between the one ends of the heating resistor and the temperature sensor, and wherein the first power source terminal of the surface-mounted oscillator is directly and electrically connected to the one end of the temperature sensor via the electrically-conducting path.

According to a fourth aspect of the invention, in the constant-temperature type crystal oscillator, wherein the temperature control circuit comprises: an operational amplifier, to which a control voltage from the temperature sensor whose one end is connected to the second power source terminal and a reference voltage are input; a power transistor having a grounded emitter in which an output current from a collector thereof is controlled by applying an output from the operational amplifier to a base thereof; and the heating resistor disposed between the collector of the power transistor and the second power source terminal.

According to the aspects of the invention, the first power source terminal provided on the outer bottom face of the case main body of the surface-mounted oscillator is, along with the one ends of the heating resistor and the temperature sensor installed on the circuit substrate, electrically connected to the second power source terminal of the circuit substrate. Then, the first power source terminal of the surface-mounted oscillator (the case main body) and the one end of the temperature sensor are directly and electrically connected via the electrically-conducting path.

Therefore, because temperatures of the case main body (the crystal unit in which the crystal element is hermetically encapsulated) and the temperature sensor are thermally coupled via the electrically-conducting path with high heat conductivity, it is possible to directly detect an operational temperature of the crystal unit. Thereby, real-time temperature control for an ambient temperature is made easy. Incidentally, the first power source terminal of the surface-mounted oscillator and the one ends of the heating resistor and the temperature sensor are essentially and electrically connected. Therefore, there is no need to provide a new electrically-conducting path, and thus the wiring on the circuit substrate becomes easy.

According to the second aspect of the invention, an operational temperature of the crystal unit, a detected temperature from the temperature sensor, and a heated temperature of the heating resistor all approximate a same temperature, which makes real-time temperature control easier.

According to the third aspect of the invention, noise contained in the power source is eliminated to improve an output from the oscillator circuit. Further, because the first power source terminal and the one end of the temperature sensor are connected via the electrically-conducting path, the advantageous effect in the first aspect is maintained.

According to the fourth aspect of the invention, the temperature control circuit is clarified.

BRIEF DESCRIPTION OF THE DRAWINGS

FIGS. 1A and 1B are diagrams of a constant-temperature type oscillator according to a first embodiment of the invention, in which FIG. 1A is a cross-sectional view of the constant-temperature type oscillator, FIG. 1B is a circuit diagram of the constant-temperature type oscillator.

FIGS. 6A and 6B are diagrams of a related art constant-temperature type oscillator, in which FIG. 6A is a cross-sectional view of the related art constant-temperature type oscillator, and FIG. 6B is an outline of a circuit diagram of the related art constant-temperature type oscillator;

FIGS. 7A and 7B are diagrams of a surface-mounted unit of the related art constant-temperature type oscillator, in which FIG. 7A is a cross-sectional view of the related art surface-mounted unit, and FIG. 7B is a bottom view of the related art surface-mounted unit;

DETAILED DESCRIPTION OF THE PREFERRED EMBODIMENTS

First Embodiment

Figure 1A:
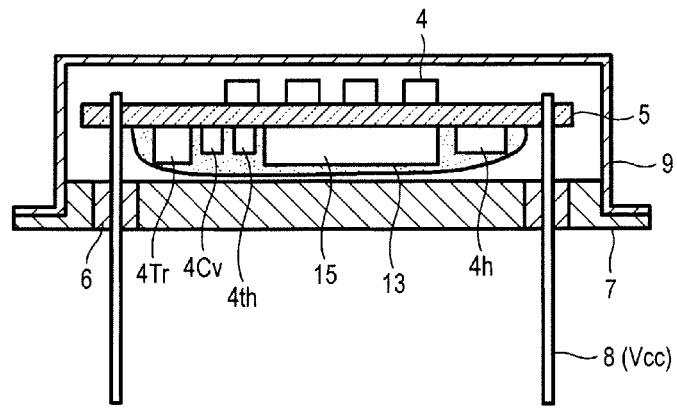
Figure 1B:
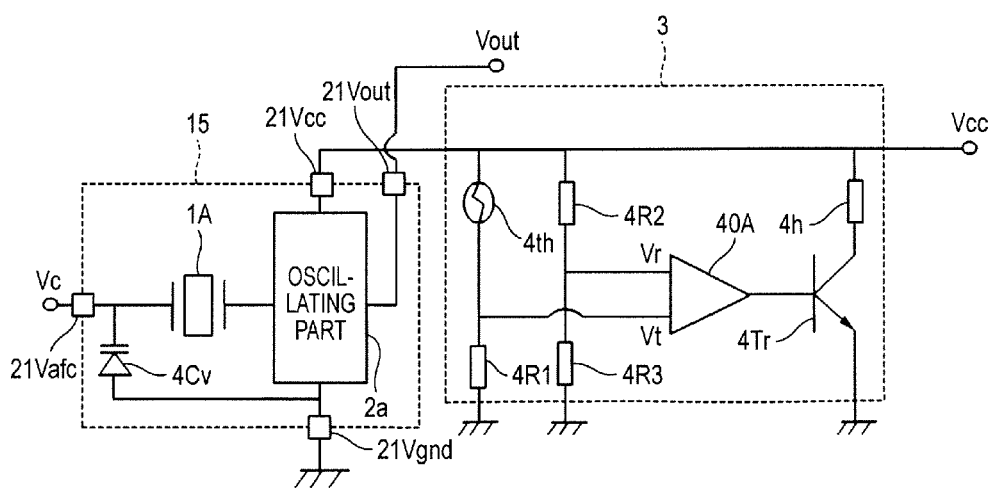
Figure 1C:
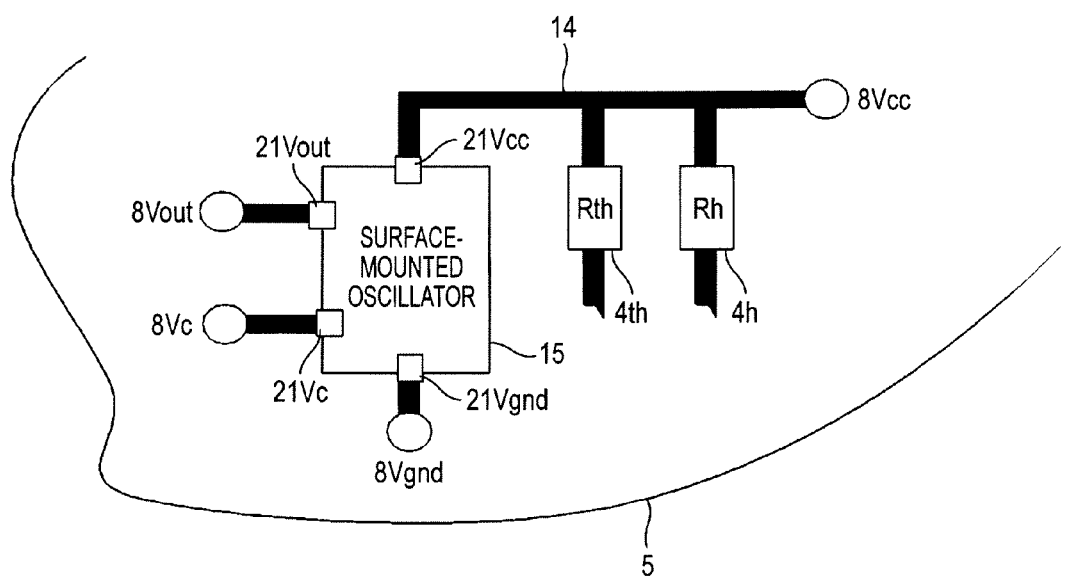
FIG. 1C is a schematic diagram showing a connection between circuit elements and an electrically-conducting path in the constant-temperature type oscillator.

FIGS. 1A to 1C are diagrams of a constant-temperature type oscillator according to a first embodiment of the invention. FIG. 1A is a cross-sectional view thereof, FIG. 1B is a circuit diagram thereof, and FIG. 1C is a schematic diagram showing a connection between circuit elements and an electrically-conducting path therein. Incidentally, portions which are the same as those in the related example are denoted by the same symbols, and descriptions thereof will be simplified or omitted.

Figure 2A:
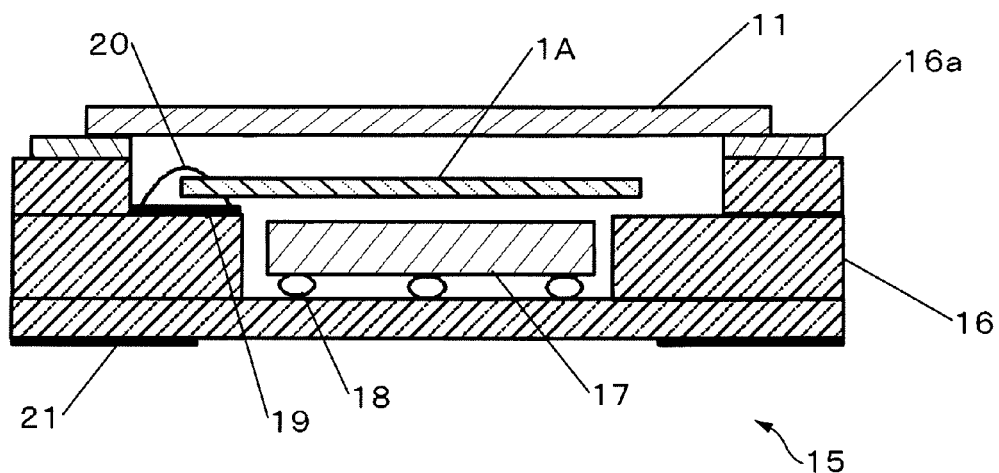
FIGS. 2A and 2B are cross-sectional views of a surface-mounted oscillator applied to the constant-temperature type oscillator of the invention.
Figure 2B:
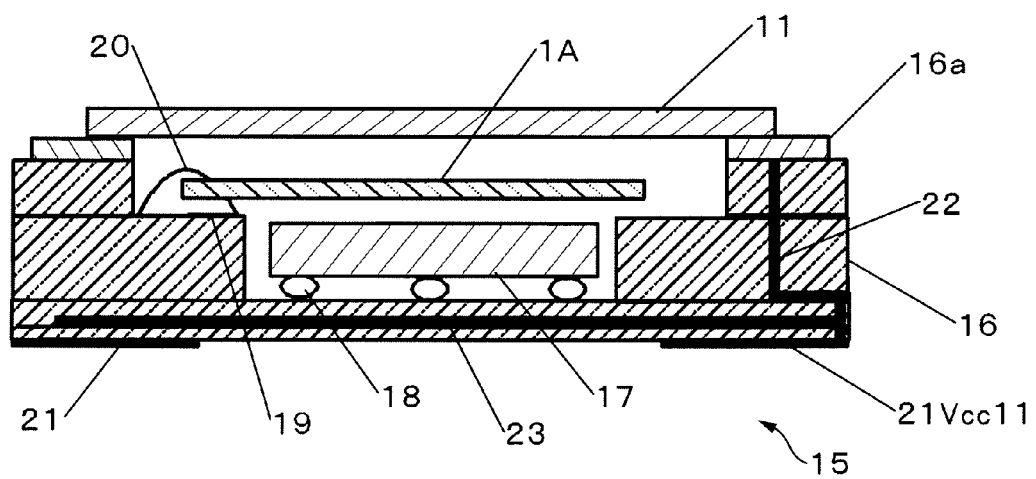

The constant-temperature type oscillator is configured such that a surface-mounted oscillator 15 in place of the surface-mounted unit 1 in the related example and the circuit elements 4 which are the same as those in the related example are installed on the circuit substrate 5, the circuit substrate 5 is held with lead wires 8 (second mounting terminals) of the base for oscillator 7, and a cover 9 covers these components. The lead wires 8 include a second power source terminal 8 (Vcc), an output terminal 8 (Vout), an earth terminal 8 (Vgnd) and a control terminal 8 (Vc). In the surface-mounted oscillator 15, as shown in FIGS. 2A and 2B, an IC chip 17 is fixed to the inner bottom face of a case main body 16 with bumps 18 by flip-chip bonding. The case main body 16 is made of laminar ceramic and has a concave shape. In the IC chip 17, at least the oscillating part 2a and the voltage-controlled capacitive element 4Cv are integrated so as to form the voltage-control type oscillator circuit 2.

Then, the both sides of one end of the crystal element 1A where a leading electrode (not shown) is extended from an excitation electrode (not shown) are firmly fixed to the inner wall shoulder of the case main body 16. The crystal holding terminal 19 is provided to the inner wall shoulder of the case main body 16, and the leading electrode of the crystal element 1A and the crystal holding terminal 19 are electrically and mechanically connected with each other by an electrically conductive adhesive 20. Then, the metal cover 11 is bonded to a metal ring 16a, which is provided on an opening end face of the case main body 16, by seam welding, for example.

According thereto, the crystal element 1A is hermetically encapsulated in the case main body 16 to form the surface-mounted oscillator 15.

First mounting terminals 21 for surface mounting are provided on the four corner portions of the outer bottom face of the case main body 16. The first mounting terminals 21 are electrically connected to IC terminals (not shown) on a circuit functional surface of the IC chip 17 via the electrically-conducting path 14. These mounting terminals 21 are composed of a first power source terminal 21 (Vcc), an output terminal 21 (Vout), an earth terminal 21 (Vgnd) and a control terminal 21 (Vc).

As shown in FIGS. 1B and 1C, in the first embodiment, the first power source terminal 21 (Vcc) of the surface-mounted oscillator 15 (the case main body 16) is electrically connected to a second power source terminal 8 (Vcc) of the circuit substrate 5. The first power source terminal 21 is also electrically connected to the one ends of the heating resistor 4h and the temperature sensor 4th in the temperature control circuit 3. Here, the first power source terminal 21 (Vcc) of the surface-mounted oscillator 15 and the one ends of the heating resistor 4h and the temperature sensor 4th are directly and electrically connected via the electrically-conducting path 14 of the circuit substrate 5. Incidentally, in a case where the circuit substrate 5 is made of a glass epoxy material, the electrically-conducting path 14 is made of Cu. In a case where the circuit substrate 5 is made of ceramic, a base electrode of the electrically-conducting path 14 is made of W, and Ni and Au are plated on the base electrode to form the electrically-conducting path 14.

In such a configuration, the first power source terminal 21 (Vcc) provided on the outer bottom face of the case main body 16 of the surface-mounted oscillator 15 is electrically connected to the second power source terminal 8 (Vcc) of the circuit substrate 5. The first power source terminal 21 (Vcc) is also electrically connected to the one ends of the heating resistor 4h and the temperature sensor 4th installed on the circuit substrate 5. Here, the first power source terminal 21 (Vcc) of the surface-mounted oscillator 15, the one ends of the heating resistor 4h and the temperature sensor 4th, and the second power source terminal 8 (Vcc) of the circuit substrate 5 are directly and electrically connected via the electrically-conducting path 14.

Accordingly, because the case main body 16 in which the crystal element 1A is hermetically encapsulated, i.e., a crystal unit, and the heating resistor 4h and the temperature sensor 4th are thermally coupled via the electrically-conducting path 14 with high heat conductivity, temperatures thereof approximate each other. Thereby, it becomes easy to control the temperature of the crystal unit in real-time for an ambient temperature. That is, the temperature control circuit 3 functions as a temperature compensate circuit that performs a temperature compensating operation of the crystal unit.

Then, the first power source terminal 21 (Vcc) of the surface-mounted oscillator 15 and the one ends of the heating resistor 4h and the temperature sensor 4th are essentially electrically connected. Therefore, there is no need to provide a new electrically-conducting path, which makes the wiring pattern by the electrically-conducting path 14 on the circuit substrate 5 easy. Further, because the surface-mounted oscillator 15 is used in place of the surface-mounted unit 1, the structure of the constant-temperature type oscillator is simplified. Accordingly, the layout of the surface-mounted oscillator 15 with respect to the circuit substrate 5 becomes easy. Herein, adjusting components and the like are discretely disposed on the top surface of the circuit substrate 5.

Incidentally, as shown in FIG. 2B, it may be configured such that the first power source terminal 21 (Vcc) of the surface-mounted oscillator 15 (the case main body 16) and the metal cover 11 are electrically connected via the through electrode 22. Further, the bottom wall of the case main body 16 may be formed into a laminated structure, and a metal film 23 connected to the first power source terminal 21 (Vcc) may be provided to the laminated structure. In these cases, it is easy to heat the case main body 16 by the metal cover 11 and the metal film 23. Accordingly, it makes further possible to perform the real-time temperature control.

Second Embodiment

Figure 3:
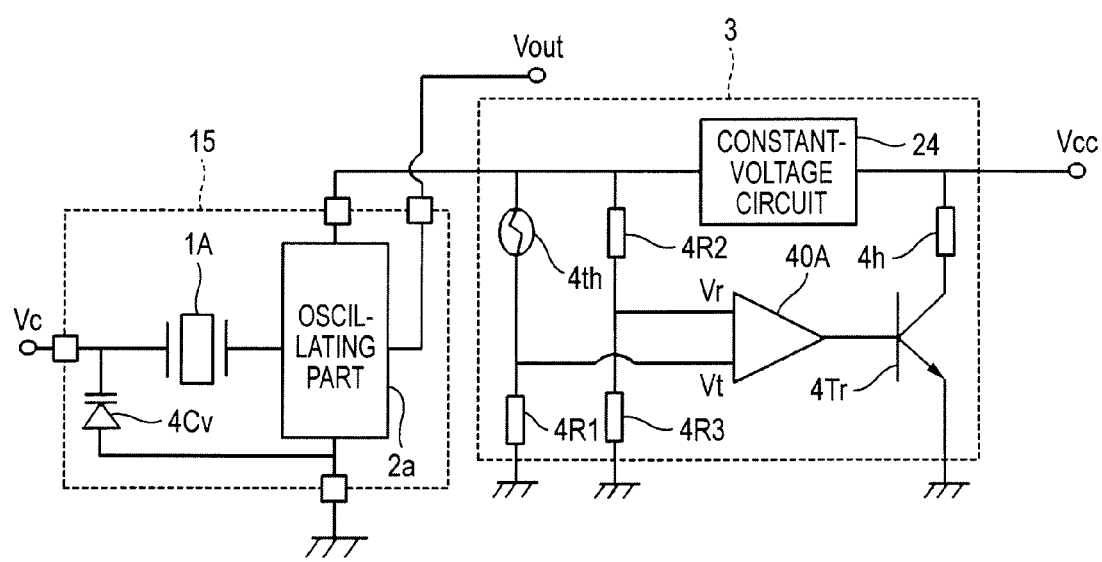
FIG. 3 is a circuit diagram of a constant-temperature type oscillator according to a second embodiment of the invention.

FIG. 3 is a circuit diagram of a constant-temperature type oscillator according to a second embodiment of the invention. Incidentally, descriptions of the same portions as those in the first embodiment will be omitted.

In the second embodiment, in the same way as in the related example, a constant-voltage circuit 24 is provided to the power source line between one end of the heating resistor 4h of the temperature control circuit 3 and one end of the resistor 4R2 forming the reference voltage Vr so as to eliminate noise contained in the power source Vcc and to improve an output from the oscillator circuit. In this case, the one end of the first power source terminal 21 (Vcc) of the surface-mounted oscillator 15 and the one end of the temperature sensor 4th are connected via the electrically-conducting path 14.

Therefore, the case main body 16 (the crystal unit in which the crystal element 1A is housed) and the temperature sensor 4th are thermally coupled via the electrically-conducting path 14. Thereby, the temperature sensor 4th directly detects an operational temperature of the crystal unit, which makes it possible to make a temperature compensating operation by the temperature control circuit 3 better than that in the related example.

Third Embodiment

Figure 4:
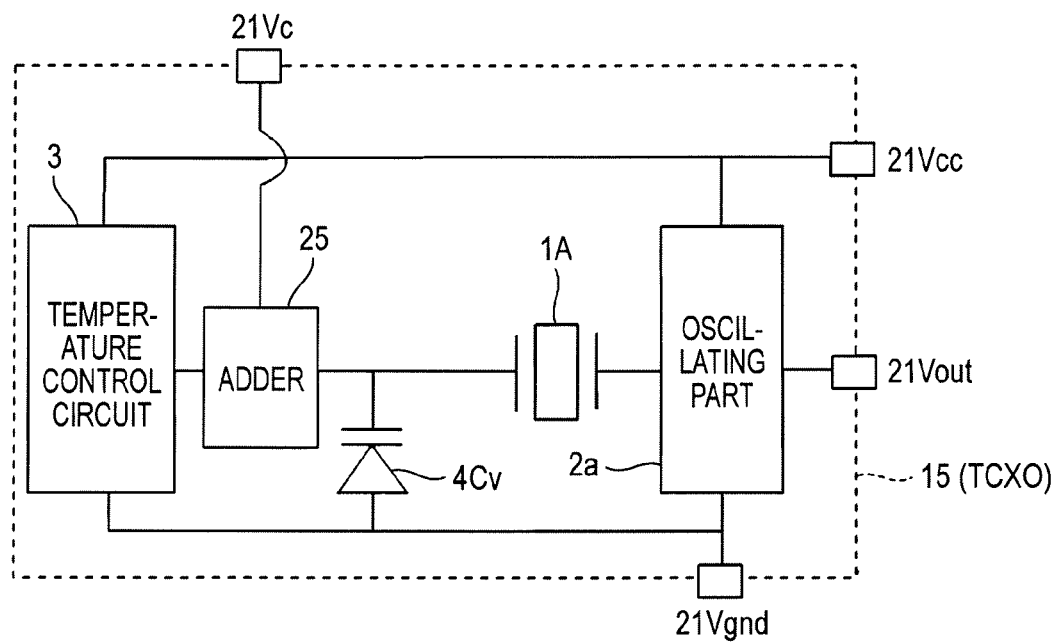
FIG. 4 is a schematic diagram of a surface-mounted oscillator of a constant-temperature type oscillator according to a third embodiment of the invention.

FIG. 4 is a schematic diagram of specifically a surface-mounted oscillator for explanation of a constant-temperature type oscillator of a third embodiment of the invention. Incidentally, descriptions of the same portions as those in the above embodiment will be omitted.

In the third embodiment, the surface-mounted oscillator 15 is formed as a temperature compensated type, a so-called, TCXO. That is, in the IC chip 17, a temperature compensating mechanism having not only the oscillating part 2a, but also at least a temperature sensor (for example, a linear resistor) is integrated, to apply a temperature compensated voltage to the voltage-controlled capacitive element 4Cv. In this case, the temperature compensated voltage is synthesized with a control voltage Vc from the control terminal 21 (Vc) by an adder 25 and is applied to the voltage-controlled capacitive element 4Cv. In such an oscillator, because its frequency-temperature characteristic temperature-compensated in advance by the TCXO is further controlled minutely by the temperature control circuit 3 formed to be a constant-temperature type, the frequency stability can be improved.

Other Aspect

Figure 5:
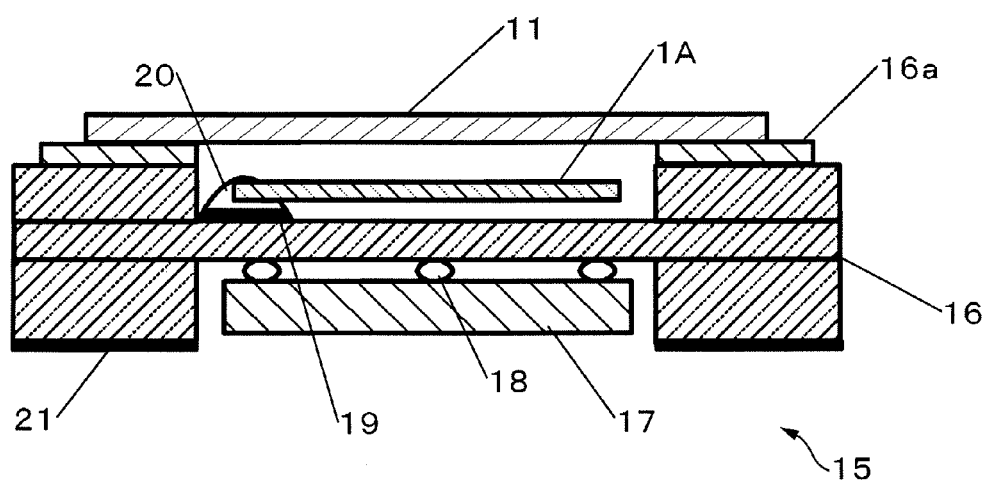
FIG. 5 is a cross-sectional view of another example of a surface-mounted oscillator applied to the constant-temperature type oscillator of the invention.
Figure 6A:
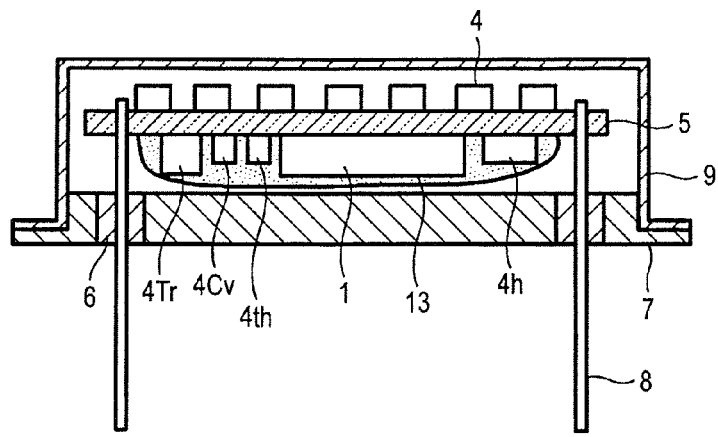
Figure 6B:
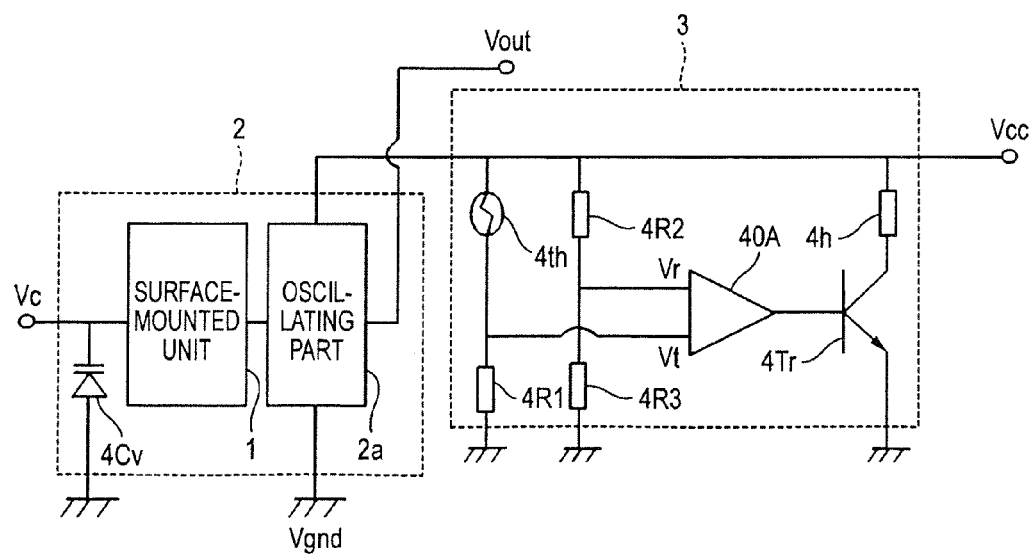
Figure 7A:
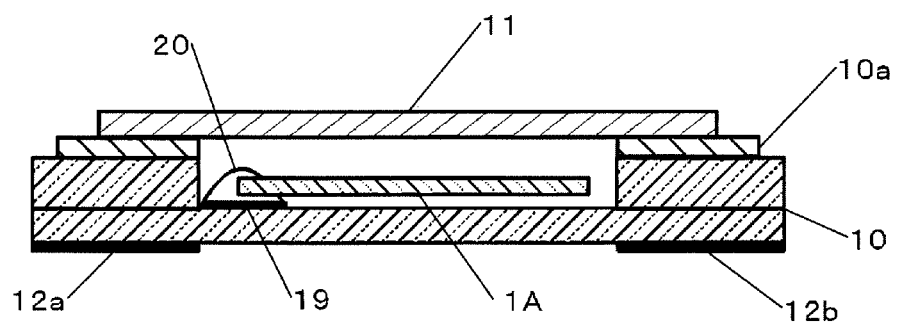
Figure 7B:
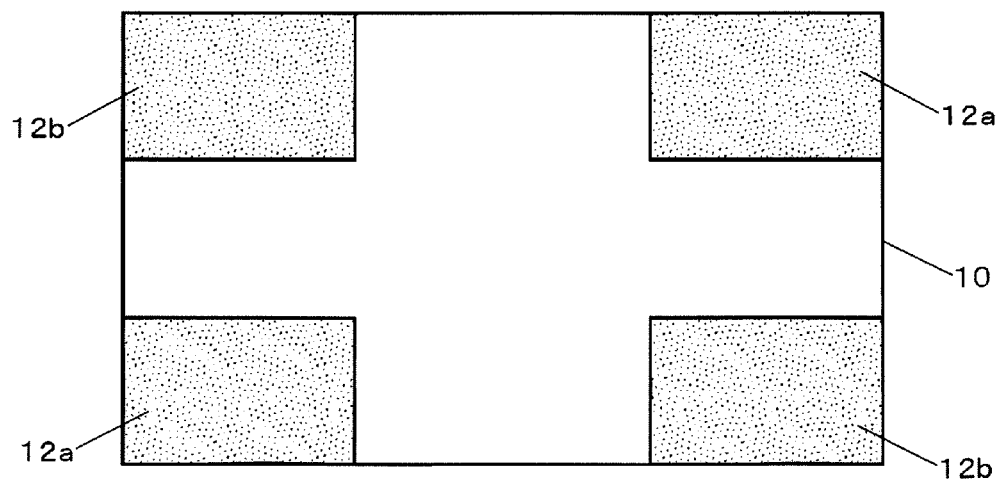
Figure 8:
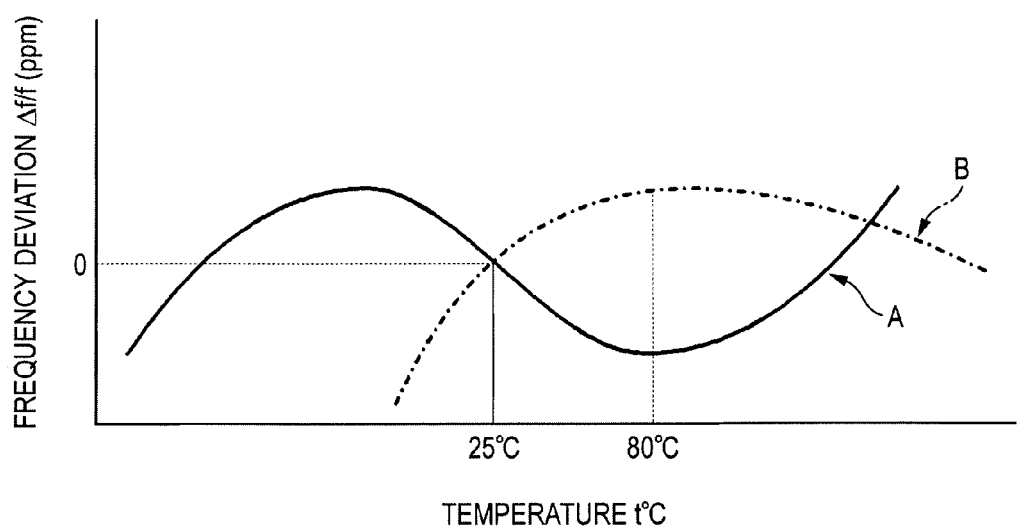
FIG. 8 is a frequency-temperature characteristic diagram of the related art surface-mounted unit (crystal oscillator)
Figure 9:
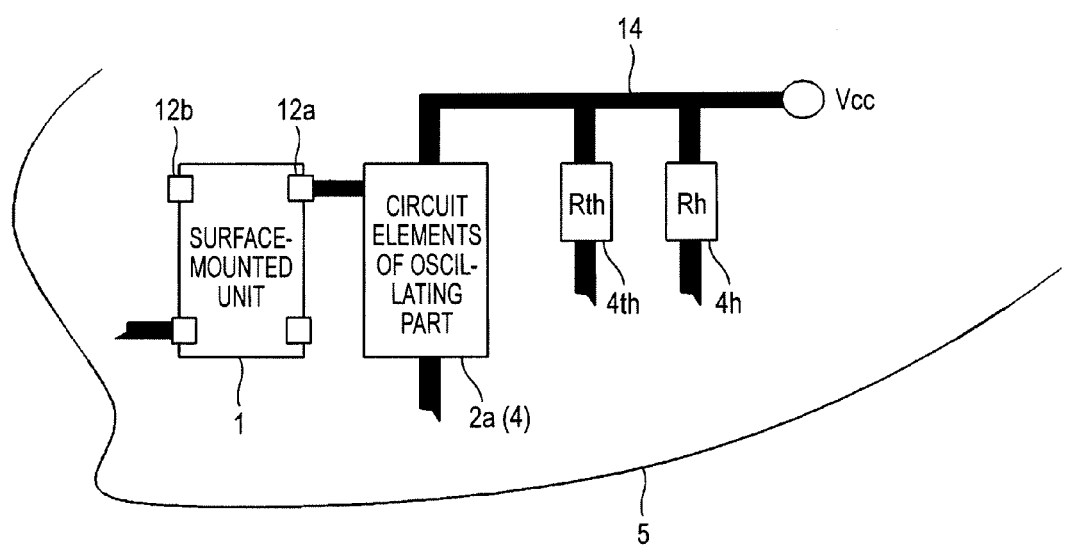
FIG. 9 is a schematic diagram of a connection between circuit elements and an electrically-conducting path in the related art surface-mounted unit.

In the above-described embodiments, the surface-mounted oscillator is configured such that the IC chip 17 and the crystal element 1A are housed in the concave portion in the one principal surface of the case main body 16. However, the surface-mounted oscillator may be configured as shown in FIG. 5, for example. That is, the crystal element 1A may be housed in the concave portion in the one principal surface of the case main body 16, to be hermetically encapsulated, and the IC chip 17 may be housed in the concave portion in the other principal surface. In this case as well, because the first power source terminal 21 (Vcc) is, along with at least the one end of the temperature sensor 4th, connected to the second power source terminal 8 (Vcc) via the electrically-conducting path 14, it is possible to directly detect an operational temperature of the crystal unit.

What is claimed is:

1. A constant-temperature type crystal oscillator comprising:
   a crystal unit comprising:
      a case main body comprising first mounting terminals for surface mounting including a first power source terminal on an outer bottom surface of the case main body; and
      a crystal element that is hermetically encapsulated in the case main body;
   a surface-mounted oscillator, which comprises an IC chip housed in the case main body,
   and which forms an oscillator circuit with at least the crystal unit;
   a temperature control circuit comprising:
      a heating resistor composed of a chip element for heating up the crystal unit; and
      a temperature sensor that detects an operational temperature of the crystal unit;
   and
   a circuit substrate, on which the surface-mounted oscillator, the heating resistor, and the temperature sensor are installed, and which comprises second mounting terminals including a second power source terminal,
   wherein one end of the heating resistor and one end of the temperature sensor are electrically connected to the second power source terminal,
   wherein the first power source terminal of the surface-mounted oscillator and the one end of the heating resistor and one end of the temperature sensor are electrically connected to the second power source terminal of the circuit substrate, and
   wherein the first power source terminal of the surface-mounted oscillator is directly and electrically connected to, at least, the one end of the temperature sensor via an electrically-conducting path.

2. The constant-temperature type crystal oscillator according to claim 1,
   wherein the first power source terminal of the surface-mounted oscillator, the one ends of the heating resistor and the temperature sensor are directly and electrically connected to the second power source terminal of the circuit substrate via the electrically-conducting path on the circuit substrate.

3. The constant-temperature type crystal oscillator according to claim 1,
   wherein a constant voltage circuit is provided between the one ends of the heating resistor and the temperature sensor, and
   wherein the first power source terminal of the surface-mounted oscillator is directly and electrically connected to the one end of the temperature sensor via the electrically-conducting path.

4. The constant-temperature type crystal oscillator according to claim 1,
   wherein the temperature control circuit comprises:
      an operational amplifier, to which a control voltage from the temperature sensor whose one end is connected to the second power source terminal and a reference voltage are input;
      a power transistor having a grounded emitter in which an output current from a collector thereof is controlled by applying an output from the operational amplifier to a base thereof; and
      the heating resistor disposed between the collector of the power transistor and the second power source terminal.

5. The constant-temperature type crystal oscillator according to claim 1, wherein said electrically conducting path electrically connects the first power source terminal of the surface-mounted oscillator, the one end of the heating resistor, the one end of the temperature sensor, and the second power source terminal of the circuit substrate.

6. The constant-temperature type crystal oscillator according to claim 5, wherein said electrically conducting path also functions as a direct heat conducting path between the crystal unit, the heating resistor, and the temperature sensor.

7. The constant-temperature type crystal oscillator according to claim 1,
   wherein the case main body further comprises a concave portion for accommodating the crystal element,
   wherein a metal cover covers the concave portion so as to hermetically the crystal element in the concave portion, and
   wherein the metal cover is electrically connected to the first power source terminal.

8. The constant-temperature type crystal oscillator according to claim 1, wherein the case main body further comprises:
   a bottom wall having a laminated structure of a plurality of plate-shaped members; and
   a side wall that is provided on the bottom wall and configures a concave portion for accommodating the crystal element, and
   wherein the laminated structure of the bottom wall includes a metal film that is connected to the first power source terminal.

* * * * *